(12) United States Patent
Lin et al.

(10) Patent No.: US 11,973,059 B2
(45) Date of Patent: Apr. 30, 2024

(54) INTEGRATED CIRCUIT PRODUCT AND CHIP FLOORPLAN ARRANGEMENT THEREOF

(71) Applicant: Alchip Technologies, Ltd., Grand Cayman (KY)

(72) Inventors: Wen-Hsi Lin, Taipei (TW); Kai-Ting Ho, Taipei (TW)

(73) Assignee: Alchip Technologies, Ltd., Grand Cayman (KY)

( * ) Notice: Subject to any disclaimer, the term of this patent is extended or adjusted under 35 U.S.C. 154(b) by 208 days.

(21) Appl. No.: 17/572,382

(22) Filed: Jan. 10, 2022

(65) Prior Publication Data

US 2022/0310562 A1    Sep. 29, 2022

Related U.S. Application Data

(60) Provisional application No. 63/166,703, filed on Mar. 26, 2021.

(30) Foreign Application Priority Data

Aug. 23, 2021    (CN) .......................... 202110969044.5

(51) Int. Cl.
*H01L 25/065*    (2023.01)
*H01L 25/18*     (2023.01)

(52) U.S. Cl.
CPC .......... *H01L 25/0655* (2013.01); *H01L 25/18* (2013.01)

(58) Field of Classification Search
CPC ........................... H01L 25/0655; H01L 25/18
See application file for complete search history.

(56) References Cited

U.S. PATENT DOCUMENTS

2006/0031801 A1*    2/2006  McIntyre .............. G06F 30/392
                                                716/55
2007/0027567 A1     2/2007  Lin et al.

FOREIGN PATENT DOCUMENTS

TW           200723356 A      6/2007

OTHER PUBLICATIONS

Taiwanese Office Action and Search Report for Taiwanese Application No. 110131167, dated Mar. 4, 2022, with English translation.

* cited by examiner

*Primary Examiner* — Walter H Swanson
(74) *Attorney, Agent, or Firm* — Birch, Stewart, Kolasch & Birch, LLP

(57) ABSTRACT

An integrated circuit product includes a first chip, a second chip, a third chip, a fourth chip, a fifth chip, a sixth chip, a seventh chip, and an eighth chip. The areas and constituent components of the first chip, the second chip, the third chip, and the fourth chip are substantially the same. The areas and constituent components of the fifth chip, the sixth chip, the seventh chip, and the eighth chip are substantially the same. The first chip, the second chip, the third chip, and the fourth chip are respectively arranged on the four sides of the integrated circuit product. The fifth chip, the sixth chip, the seventh chip, and the eighth chip are arranged in a central area of the integrated circuit product.

20 Claims, 11 Drawing Sheets

INTEGRATED CIRCUIT PRODUCT AND CHIP FLOORPLAN ARRANGEMENT THEREOF

CROSS-REFERENCE TO RELATED APPLICATIONS

This application claims the benefit of priority to Patent Application No. 202110969044.5, filed in China on Aug. 23, 2021; the entirety of which is incorporated herein by reference for all purposes.

This application claims the benefit of priority to U.S. Provisional Application Ser. No. 63/166,703, filed on Mar. 26, 2021; the entirety of which is incorporated herein by reference for all purposes.

BACKGROUND

The present invention generally relates to the packaging of integrated circuits (ICs), and, more particularly, to the floorplan arrangement of the chips and/or chiplets (hereinafter collectively referred to as chips) of IC packaging.

Nowadays advanced packaging is common in the IC industry. However, the poor floorplan arrangement may result in the following drawbacks: wasted area (which renders the finished product uncompetitive due to the large size), poor heat dissipation (which degrades the chip performance), difficulty in output and/or input wiring (which increases the difficulty of packaging), and/or non-ideal relative positions of the chips (which causes waste of chip pins). Therefore, a floorplan arrangement of the chips is needed to solve at least one of the above-mentioned problems.

SUMMARY

An example embodiment of an integrated circuit (IC) product is disclosed, comprising: a first chip, a second chip, a third chip, a fourth chip, a fifth chip, a sixth chip, a seventh chip, and an eighth chip. The first chip, the second chip, the third chip, and the fourth chip have substantially identical area and constituent components. The fifth chip, the sixth chip, the seventh chip, and the eighth chip have substantially identical area and constituent components. The first chip, the second chip, the third chip, and the fourth chip are arranged on four sides of the IC product, respectively. The fifth chip, the sixth chip, the seventh chip, and the eighth chip are arranged in a central area of the IC product.

Another example embodiment of an integrated circuit (IC) product which has a first side, a second side, a third side, and a fourth side is disclosed, comprising: a first logic chip arranged on the first side, a second logic chip arranged on the second side, a third logic chip arranged on the third side, a fourth logic chip arranged on the fourth side, a first memory chip, a second memory chip, a third memory chip, and a fourth memory chip. A floorplan arrangement of the first logic chip, the second logic chip, the third logic chip, and the fourth logic chip possesses point symmetry with respect to a center of the IC product, and a floorplan arrangement of the first memory chip, the second memory chip, the third memory chip, and the fourth memory chip possesses point symmetry with respect to the center.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
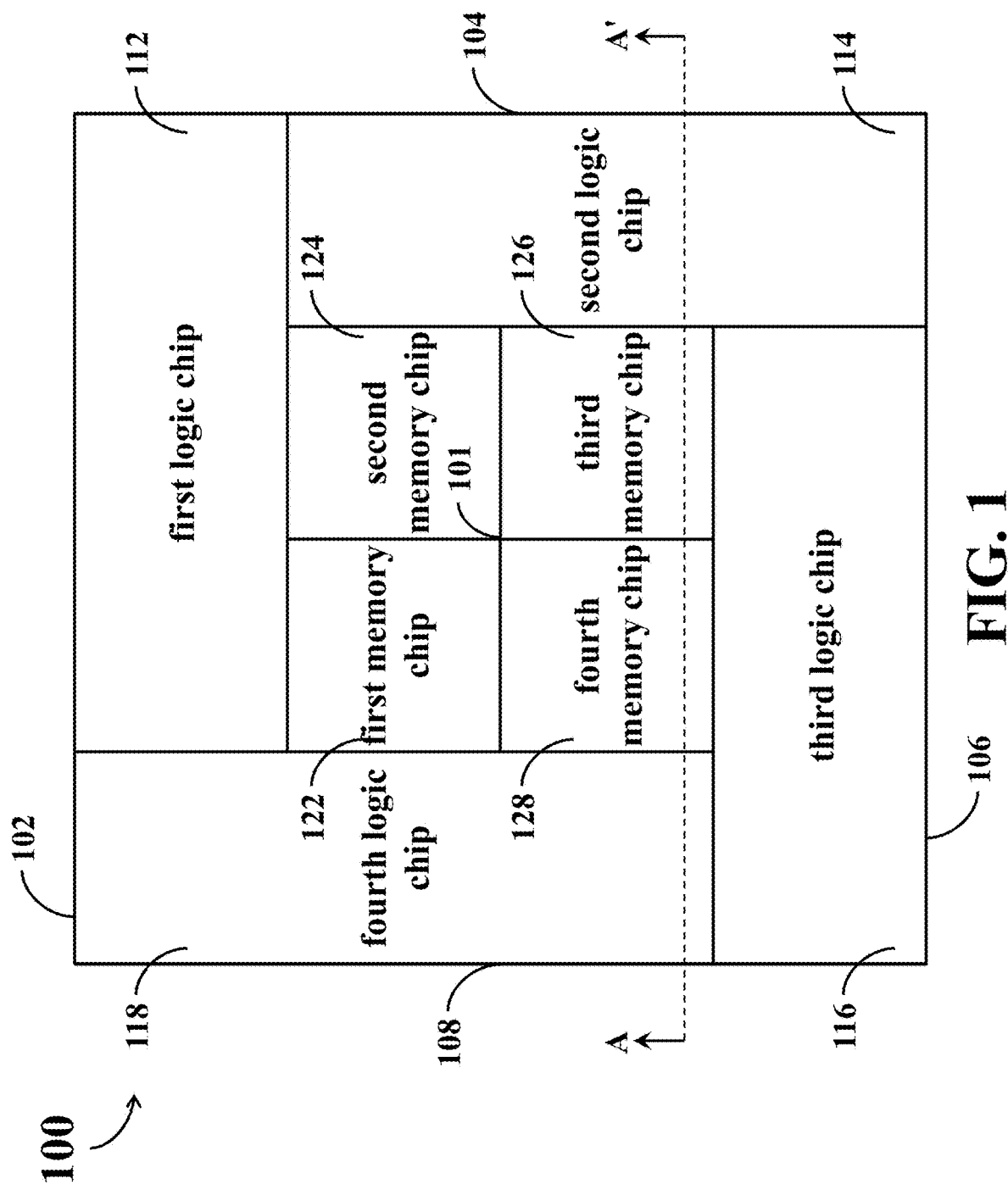
FIG. 1 illustrates a schematic diagram of a simplified chip floorplan arrangement of an IC product according to an embodiment of the present invention.
Figure 2:
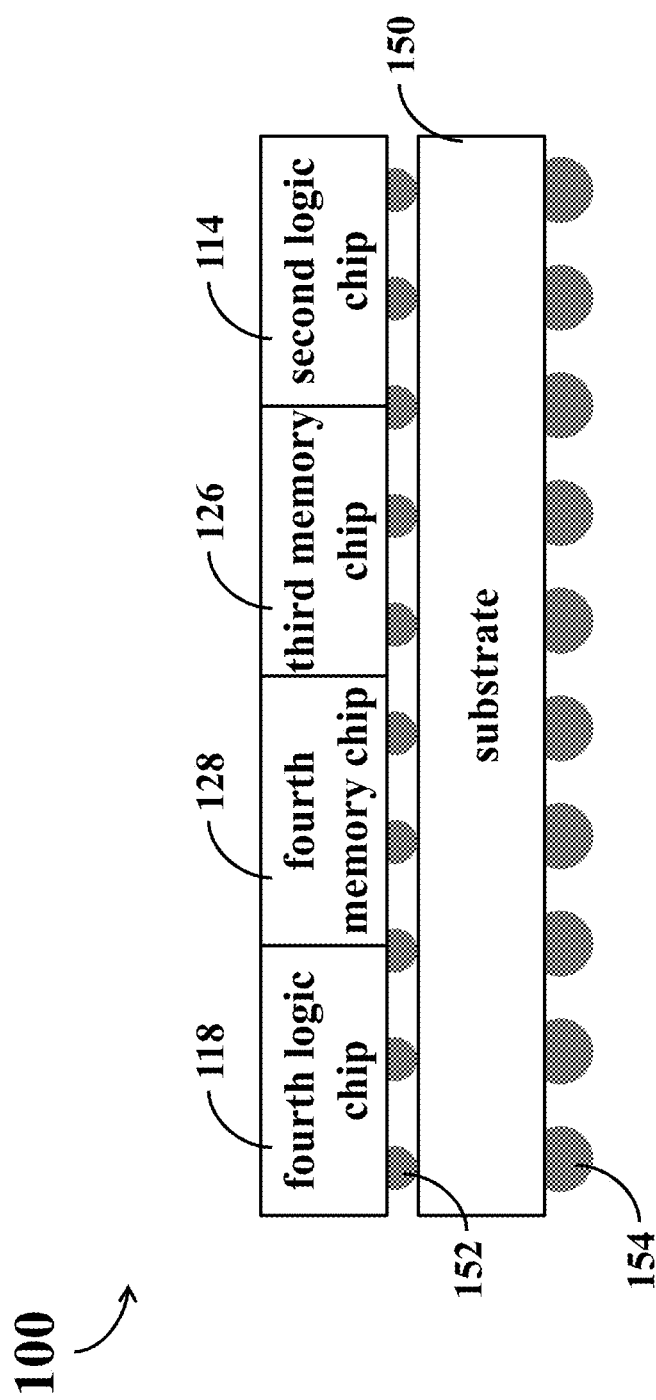
FIG. 2 illustrates a simplified side view of an IC product according to an embodiment of the present invention.
Figure 3:
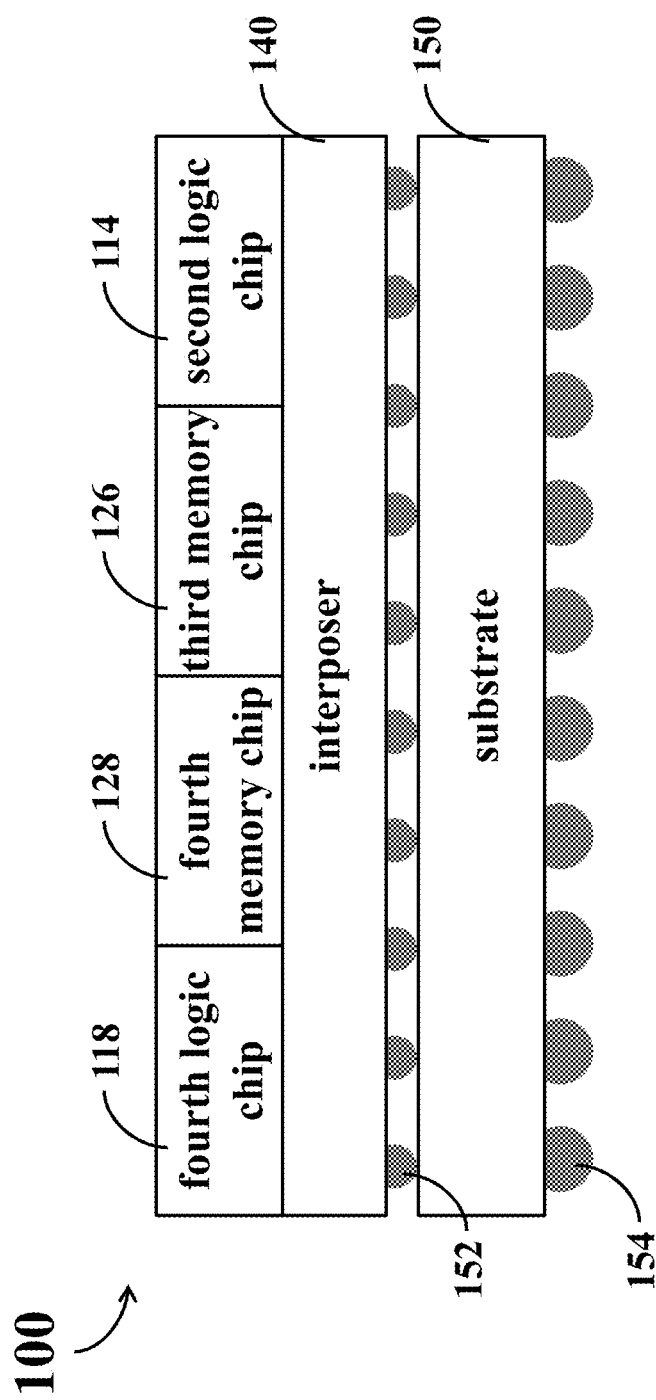
FIG. 3 illustrates a simplified side view of an IC product according to another embodiment of the present invention.

FIG. 1 is a schematic diagram of a simplified chip floorplan arrangement of an IC product according to an embodiment of the present invention. The IC product 100 includes a first logic chip 112, a second logic chip 114, a third logic chip 116, a fourth logic chip 118, a first memory chip 122, a second memory chip 124, a third memory chip 126, and a fourth memory chip 128. FIG. 1 shows a top view of an IC product 100, and FIGS. 2 and 3 each show a simplified side view of an IC product (along the A-A' cross-section in FIG. 1) according to an embodiment of the present invention. In the embodiment of FIG. 2, the IC product 100 includes a substrate 150, and the logic chips and the memory chips shown in FIG. 1 are arranged on the substrate 150. There are multiple micro bumps 152 between the substrate 150 and the logic chips and between the substrate 150 and the memory chips, and there are multiple bumps 154 under the substrate 150. In the embodiment of FIG. 3, the IC product 100 includes an interposer 140, and the logic chips and the memory chips shown in FIG. 1 are arranged on the interposer 140. There are multiple micro bumps 152 between the interposer 140 and the substrate 150, and there are multiple bumps 154 under the substrate 150. The first logic chip 112, the second logic chip 114, the third logic chip 116, and the fourth logic chip 118 may be logic circuits with computing capabilities, such as System on a Chip (SoC). The logic chips can carry out specific functions by accessing the memory chips. For example, the logic chips carry out the functions by reading and executing the program codes or program instructions stored in the memory chips.

Reference is made back to FIG. 1. The IC product 100 has a first side 102, a second side 104, a third side 106, and a fourth side 108. The four sides of the IC product 100 may be the four sides of the substrate 150. The IC product 100 further has a center 101. The first logic chip 112 is arranged on the first side 102, that is, the first logic chip 112 is located on the first side 102, which means that the first logic chip 112 is adjacent to the first side 102 (i.e., one side of the first logic chip 112 is substantially aligned with the first side 102, or the first logic chip 112 is substantially aligned with the substrate 150 by the edge). Similarly, the second logic chip 114 is located on (equivalent to being arranged on, adjacent to) the second side 104, the third logic chip 116 is located on the third side 106, and the fourth logic chip 118 is located on the fourth side 108.

The first logic chip 112, the second logic chip 114, the third logic chip 116, and the fourth logic chip 118 are arranged in a circle on the four sides of the IC product 100. The first logic chip 112 is adjacent to the fourth logic chip 118 and the second logic chip 114; the second logic chip 114 is adjacent to the first logic chip 112 and the third logic chip 116; the third logic chip 116 is adjacent to the second logic chip 114 and the fourth logic chip 118; and the fourth logic chip 118 is adjacent to the third logic chip 116 and the first logic chip 112.

Figure 4:
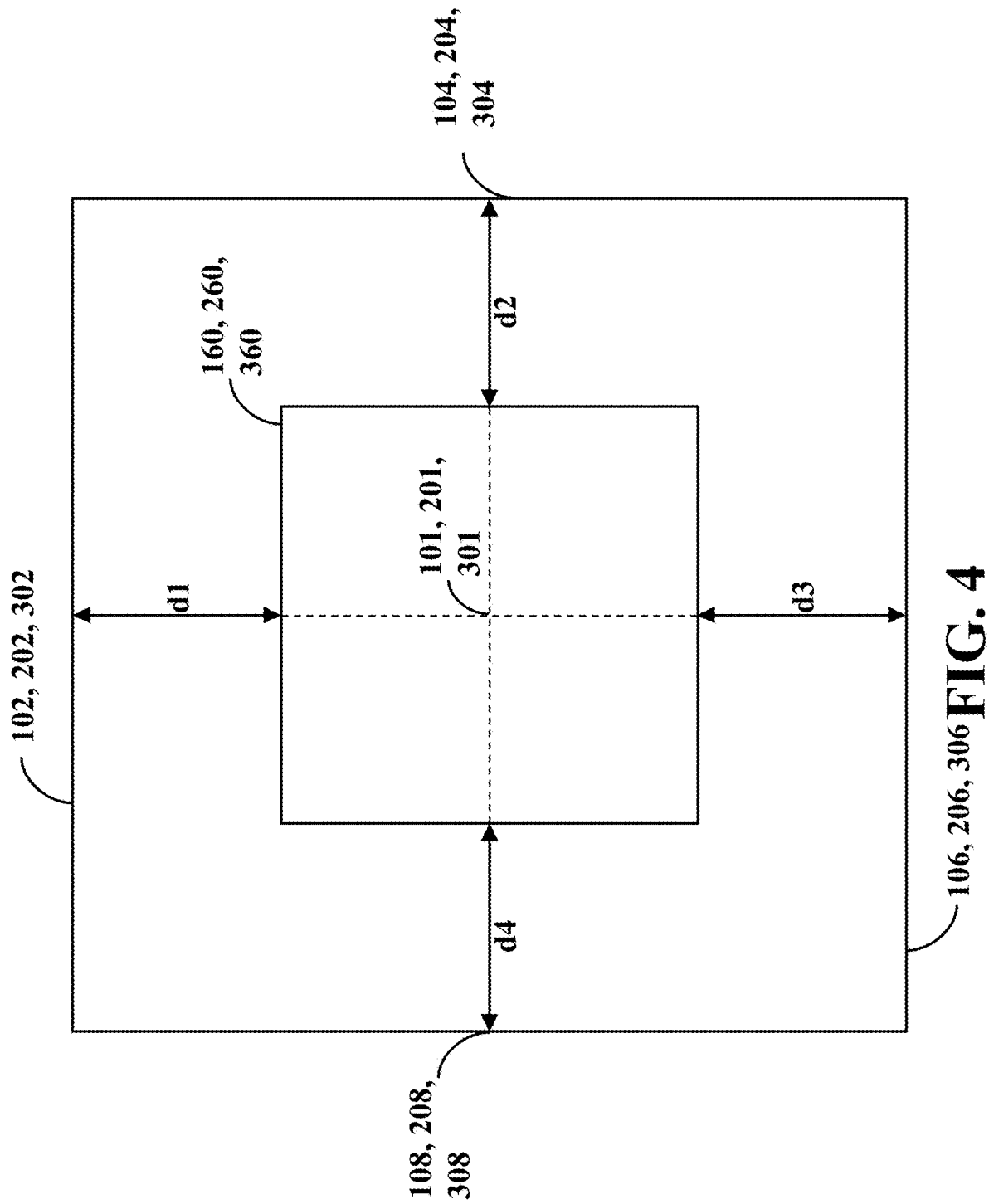
FIG. 4 illustrates the relationship between the central area and the sides of the IC product according to the present invention.

The first memory chip 122, the second memory chip 124, the third memory chip 126, and the fourth memory chip 128 are not adjacent to any side of the IC product 100; rather, the first logic chip 112, the second logic chip 114, the third logic chip 116, and the fourth logic chip 118 collectively surround the four memory chips. More specifically, as shown in FIG. 4, the first memory chip 122, the second memory chip 124, the third memory chip 126, and the fourth memory chip 128 are located in the central area 160 of the IC product 100. The distances between the central area 160 and the first side 102, the second side 104, the third side 106, and the fourth side 108 are d1, d2, d3, and d4, respectively, with d1, d2, d3, and d4 being substantially identical. As shown in FIG. 1, the central area 160 is completely enclosed by the first logic chip 112, the second logic chip 114, the third logic chip 116, and the fourth logic chip 118; that is, the four sides of the central area 160 are completely adjacent to the first logic chip 112, the second logic chip 114, the third logic chip 116, and the fourth logic chip 118, respectively.

In some embodiments, the areas of the first logic chip 112, the second logic chip 114, the third logic chip 116, and the fourth logic chip 118 are substantially identical, and the areas of the first memory chip 122, the second memory chip 124, the third memory chip 126, and the fourth memory chip 128 are substantially identical.

In some embodiments, the first logic chip 112, the second logic chip 114, the third logic chip 116, and the fourth logic chip 118 include substantially the same constituent components, and the first memory chip 122, the second memory chip 124, the third memory chip 126, and the fourth memory chip 128 include substantially the same constituent components. The constituent components include, but are not limited to, transistors, resistors, capacitors, and/or inductors. In other embodiments, the constituent components of the first logic chip 112, the second logic chip 114, the third logic chip 116, and the fourth logic chip 118 are the same in terms of both type(s) and quantity, and the constituent components of the first memory chip 122, the second memory chip 124, the third memory chip 126, and the fourth memory chip 128 are the same in terms of both type(s) and quantity.

Figure 5:
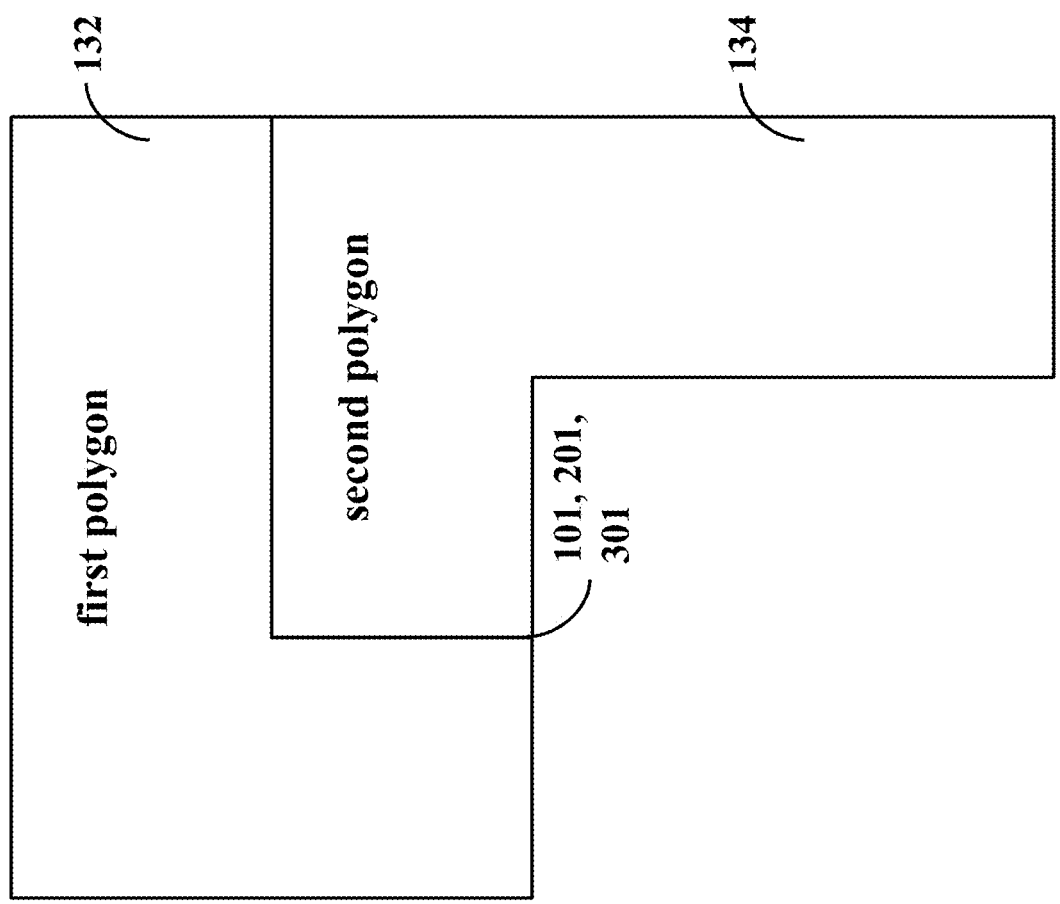
FIG. 5 illustrates the constituent units of an IC product according to an embodiment of the present invention.

The first logic chip 112 is adjacent to the first memory chip 122, the second memory chip 124, and the second logic chip 114, and the relative position between the first logic chip 112 and the first memory chip 122 is substantially identical to the relative position between the second logic chip 114 and the second memory chip 124. More specifically, please refer to FIG. 1 and FIG. 5 at the same time. The first logic chip 112 and the first memory chip 122 form a first polygon 132, and the second logic chip 114 and the second memory chip 124 form a second polygon 134. If the first polygon 132 is rotated 90 degrees clockwise with respect to the center 101 of the IC product 100, it will completely overlap with the second polygon 134. Namely, the first polygon 132 and the second polygon 134 are rotationally symmetric (the center of rotational symmetry being the center 101, and the rotation angle being 90 degrees). Similarly, the third logic chip 116 is adjacent to the third memory chip 126, the fourth memory chip 128, and the fourth logic chip 118, and the relative position between the third logic chip 116 and the third memory chip 126 is substantially identical to the relative position between the fourth logic chip 118 and the fourth memory chip 128. In other words, in some embodiments, the first logic chip 112 and the first memory chip 122 together form a constituent unit of the IC product 100, so do the second logic chip 114 and the second memory chip 124, the third logic chip 116 and the third memory chip 126, as well as the fourth logic chip 118 and the fourth memory chip 128; that is, the first logic chip 112, the second logic chip 114, the third logic chip 116, and the fourth logic chip 118 can access or be coupled to the first memory chip 122, the second memory chip 124, the third memory chip 126, and the fourth memory chip 128, respectively. One of the advantages of such an arrangement is that the outward pins (i.e., the pins to the outside of the IC product 100) of the first logic chip 112 (the second logic chip 114, the third logic chip 116, or the fourth logic chip 118) can be arranged on the first side 102 (the second side 104, the third side 106, or the fourth side 108), while the inward pins (e.g., the pins communicating with the first memory chip 122, the second memory chip 124, the third memory chip 126, or the fourth memory chip 128) can be arranged on the side that borders the memory chip. In this way, because the floorplan arrangement of the IC product 100 is simple (by merely rotating the first polygon by 90 degrees, 180 degrees, and 270 degrees), different areas of the IC product 100 can be manufactured using the same photomask, which greatly simplifies the manufacturing process without wasted pins.

Figure 6:
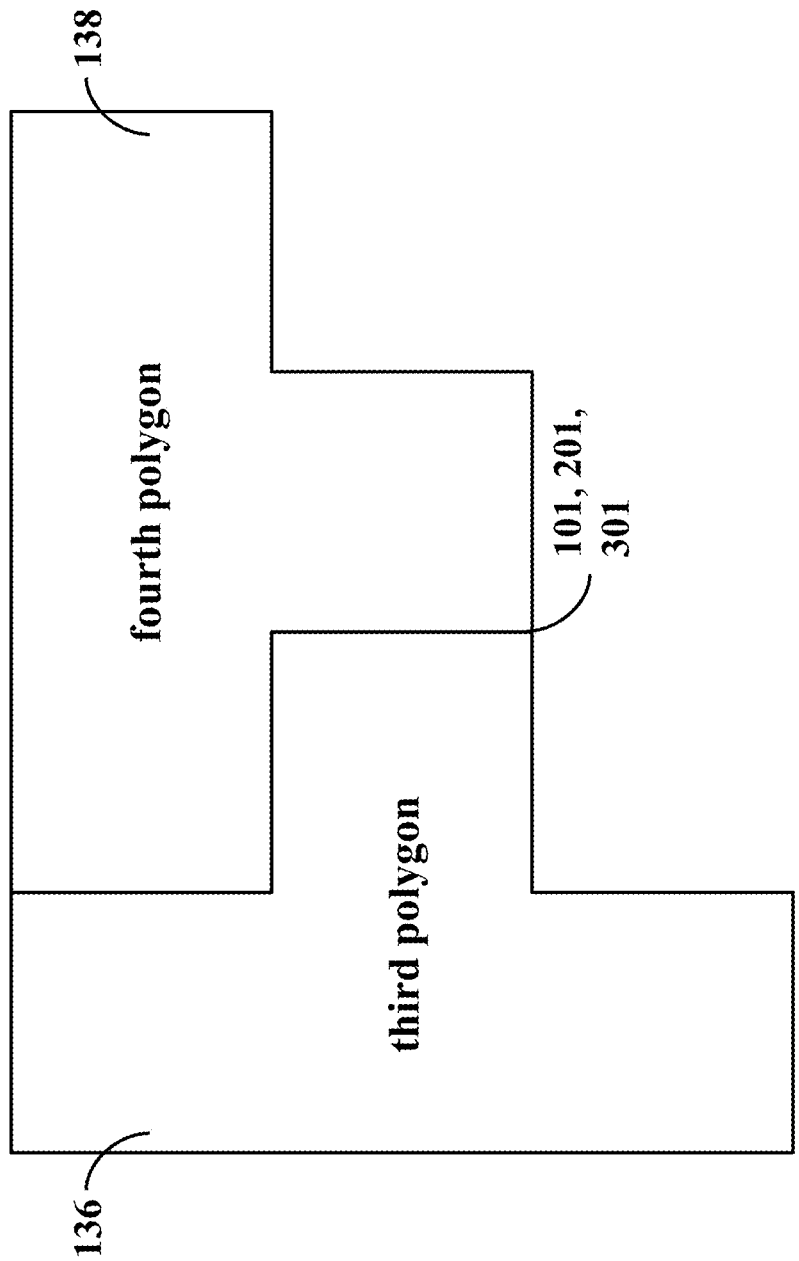
FIG. 6 illustrates the constituent units of an IC product according to another embodiment of the present invention.

From another perspective, the first logic chip 112 is adjacent to the first memory chip 122, the second memory chip 124, and the fourth logic chip 118, and the relative position between the first logic chip 112 and the second memory chip 124 is substantially identical to the relative position between the fourth logic chip 118 and the first memory chip 122. More specifically, please refer to FIG. 1 and FIG. 6 at the same time. The fourth logic chip 118 and the first memory chip 122 form a third polygon 136, and the first logic chip 112 and the second memory chip 124 form a fourth polygon 138. If the third polygon 136 is rotated 90 degrees clockwise with respect to the center 101 of the IC product 100, it will completely overlap with the fourth polygon 138. Namely, the third polygon 136 and the fourth polygon 138 are rotationally symmetric (the center of rotational symmetry being the center 101, and the rotation angle being 90 degrees). Similarly, the third logic chip 116 is adjacent to the third memory chip 126, the fourth memory chip 128, and the second logic chip 114, and the relative position between the third logic chip 116 and the fourth memory chip 128 is substantially identical to the relative position between the second logic chip 114 and the third memory chip 126. In other words, in other embodiments, the first logic chip 112 and the second memory chip 124 together form a constituent unit of the IC product 100, so do the second logic chip 114 and the third memory chip 126, the third logic chip 116 and fourth memory chip 128, as well as the fourth logic chip 118 and the first memory chip 122; that is, the first logic chip 112, the second logic chip 114, the third logic chip 116, and the fourth logic chip 118 can access or be coupled to the second memory chip 124, the third memory chip 126, the fourth memory chip 128, and the first memory chip 122, respectively. The advantages of such an arrangement are similar to or the same as the advantages discussed in the preceding paragraph, and the details are thus omitted for brevity.

If the first logic chip 112, the second logic chip 114, the third logic chip 116, and the fourth logic chip 118 are rotated 180 degrees with respect to the center 101, the first logic chip 112 and the third logic chip 116 substantially overlap, and the second logic chip 114 and the fourth logic chip 118 substantially overlap. In other words, the first logic chip 112 and the third logic chip 116 are point-symmetric with respect to the center 101 (i.e., the center of symmetry), and the second logic chip 114 and the fourth logic chip 118 are point-symmetric. Similarly, the first memory chip 122 and the third memory chip 126 are point-symmetric with respect to the center 101, and the second memory chip 124 and the fourth memory chip 128 are point-symmetric with respect to the center 101. In other words, the overall floorplan arrangement of the first logic chip 112, the second logic chip 114, the third logic chip 116, the fourth logic chip 118, the first memory chip 122, the second memory chip 124, the third memory chip 126, and the fourth memory chips 128 possesses point symmetry with respect to the center 101.

In other embodiments, the IC product 100 is a square.

Figure 7:
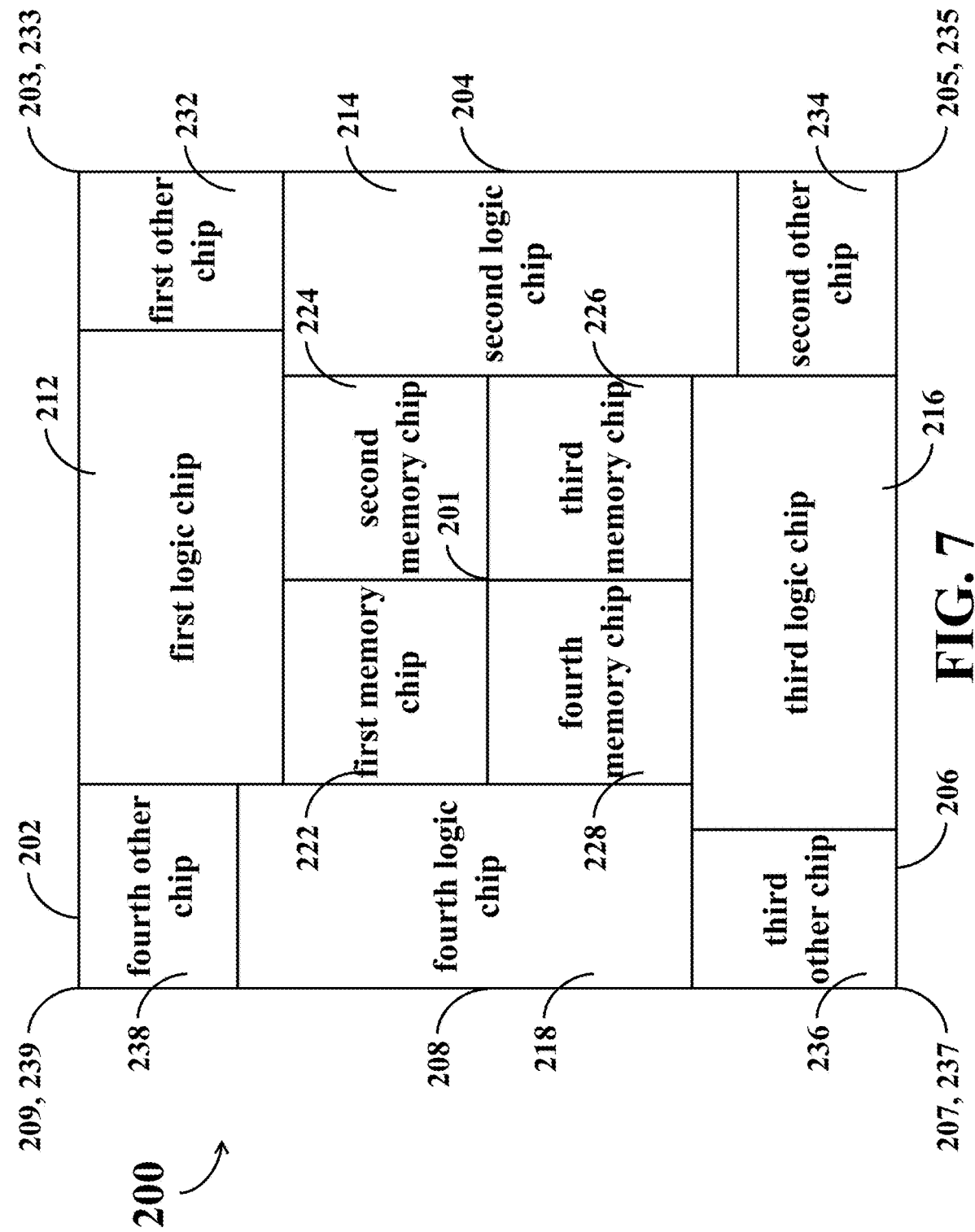
FIG. 7 illustrates a schematic diagram of a simplified chip floorplan arrangement of an IC product according to another embodiment of the present invention.

FIG. 7 is a schematic diagram of a simplified chip floorplan arrangement of an IC product according to another embodiment of the present invention. FIG. 7 shows a top view of the IC product 200. The IC product 200 includes a first logic chip 212, a second logic chip 214, a third logic chip 216, a fourth logic chip 218, a first memory chip 222, a second memory chip 224, and a third memory chip 226, a fourth memory chip 228, a first other chip 232, a second other chip 234, a third other chip 236, and a fourth other chip 238. Similar to the IC product 100, the IC product 200 includes a substrate and may or may not include an interposer (please refer to FIGS. 2 and 3).

In some embodiments, the first other chip 232, the second other chip 234, the third other chip 236, and the fourth other chip 238 are input/output (I/O) chips that contain I/O circuits, and the first logic chip 212, the second logic chip 214, the third logic chip 216, and the fourth logic chip 218 use the I/O circuits to transmit or receive signals. In other embodiments, the first other chip 232, the second other chip 234, the third other chip 236, and the fourth other chip 238 are silicon chips that do not contain any circuits.

The first logic chip 212, the second logic chip 214, the third logic chip 216, and the fourth logic chip 218 are respectively located on the first side 202, the second side 204, the third side 206, and the fourth side 208 of the IC product 200, and the first memory chip 222, the second memory chip 224, the third memory chip 226, and the fourth memory chip 228 are located in the central area 260 of the IC product 200. Reference is made to FIG. 4. The central area 260 of the IC product 200 is the area where the first memory chip 222, the second memory chip 224, the third memory chip 226, and the fourth memory chip 228 are located.

In some embodiments, the areas of the first logic chip 212, the second logic chip 214, the third logic chip 216, and the fourth logic chip 218 are substantially the same; the areas of the first memory chip 222, the second memory chip 224, the third memory chip 226, and the fourth memory chip 228 are substantially the same; and the areas of the first other chip 232, the second other chip 234, the third other chip 236, and the fourth other chip 238 are substantially the same.

In some embodiments, the first logic chip 212, the second logic chip 214, the third logic chip 216, and the fourth logic chip 218 include substantially the same constituent components; the first memory chip 222, the second memory chip 224, the third memory chip 226, and the fourth memory chip 228 include substantially the same constituent components; and the first other chip 232, the second other chip 234, the third other chip 236, and the fourth other chip 238 include substantially the same constituent components. The constituent components include, but are not limited to, transistors, resistors, capacitors, and/or inductors. In other embodiments, the constituent components of the first logic chip 212, the second logic chip 214, the third logic chip 216, and the fourth logic chip 218 are the same in terms of both type(s) and quantity; the constituent components of the first memory chip 222, the second memory chip 224, the third memory chip 226, and the fourth memory chip 228 are the same in terms of both type(s) and quantity; and the constituent components of the first other chip 232, the second other chip 234, the third other chip 236, and the fourth other chip 238 are the same in terms of both type(s) and quantity.

Similar to the embodiment in FIG. 1, the first logic chip 212, the second logic chip 214, the third logic chip 216, and the fourth logic chip 218 collectively surround the central area 260 of the IC product 200. More specifically, the four sides of the central area 260 are completely adjacent to the first logic chip 212, the second logic chip 214, the third logic chip 216, and the fourth logic chip 218, respectively; namely, the central area 260 of the IC product 200 is completely enclosed by the first logic chip 212, the second logic chip 214, the third logic chip 216, and the fourth logic chip 218.

The first other chip 232, the second other chip 234, the third other chip 236, and the fourth other chip 238 are located outside the central area 260 of the IC product 200. More specifically, the first other chip 232, the second other chip 234, the third other chip 236, and the fourth other chip 238 are located at the four corners of the IC product 200, respectively. That is to say, the first vertex 233 of the first other chip 232 is aligned with the first vertex 203 of the IC product 200, the second vertex 235 of the second other chip 234 is aligned with the second vertex 205 of the IC product 200, the third vertex 237 of the third other chip 236 is aligned with the third vertex 207 of the IC product 200, and the fourth vertex 239 of the fourth other chip 238 is aligned with the fourth vertex 209 of the IC product 200.

If the first logic chip 212, the second logic chip 214, the third logic chip 216, and the fourth logic chip 218 are rotated 180 degrees with respect to the center 201, the first logic chip 212 and the third logic chip 216 substantially overlap, and the second logic chip 214 and the fourth logic chip 218 substantially overlap. In other words, the first logic chip 212 and the third logic chip 216 are point-symmetric with respect to the center 201 (i.e., the center of symmetry), and the second logic chip 214 and the fourth logic chip 218 are point-symmetric. Similarly, the first memory chip 222 and the third memory chip 226 are point-symmetric with respect to the center 201, and the second memory chip 224 and the fourth memory chip 228 are point-symmetric with respect to the center 201. Similarly, the first other chip 232 and the third other chip 236 are point-symmetric with respect to the center 201, and the second other chip 234 and the fourth other chip 238 are point-symmetric with respect to the center 201. In other words, the overall floorplan arrangement of the first logic chip 212, the second logic chip 214, the third logic chip 216, the fourth logic chip 218, the first memory chip 222, the second memory chip 224, the third memory chip 226, the fourth memory chip 228, the first other chip 232, the second other chip 234, the third other chip 236, and the fourth other chip 238 possesses point symmetry with respect to the center 201.

In other embodiments, the IC product 200 is a square.

The first logic chip 212 is adjacent to the first memory chip 222, the second memory chip 224, and the first other chip 232, and the relative position between the first logic chip 212 and the first memory chip 222 is substantially identical to the relative position between the second logic chip 214 and the second memory chip 224. More specifically, please refer to FIG. 5 and FIG. 7 at the same time. The first logic chip 212, the first memory chip 222, and the first other chip 232 form the first polygon 132, and the second logic chip 214, the second memory chip 224, and the second other chip 234 form the second polygon 134. If the first polygon 132 is rotated 90 degrees clockwise with respect to the center 201 of the IC product 200, it will completely overlap with the second polygon 134. Similarly, the third logic chip 216 is adjacent to the third memory chip 226, the fourth memory chip 228, and the third other chip 236, and the relative position between the third logic chip 216 and the third memory chip 226 is substantially identical to the relative position between the fourth logic chip 218 and the fourth memory chip 228. In other words, in some embodiments, the first logic chip 212, the second logic chip 214, the third logic chip 216, and the fourth logic chip 218 can access or be coupled to the first memory chip 222, the second memory chip 224, the third memory chip 226, and the fourth memory chip 228, respectively.

From another perspective, the first logic chip 212 is adjacent to the first memory chip 222, the second memory chip 224, the first other chip 232, and the fourth other chip 238, and the relative position between the first logic chip 212 and the second memory chip 224 is substantially identical to the relative position between the fourth logic chip 218 and the first memory chip 222. More specifically, please refer to FIG. 6 and FIG. 7 at the same time. The fourth logic chip 218, the first memory chip 222, and the fourth other chip 238 form the third polygon 136, and the first logic chip 212, the second memory chip 224, and the first other chip 232 form the fourth polygon 138. If the third polygon 136 is rotated 90 degrees clockwise with respect to the center 201 of the IC product 200, it will completely overlap with the fourth polygon 138. Similarly, the third logic chip 216 is adjacent to the third memory chip 226, the fourth memory chip 228, the second other chip 234, and the third other chip 236, and the relative position between the third logic chip 216 and the fourth memory chip 228 is substantially identical to the relative position between the second logic chip 214 and the third memory chip 226. In other words, in other embodiments, the first logic chip 212, the second logic chip 214, the third logic chip 216, and the fourth logic chip 218 can access or be coupled to the second memory chip 224, the third memory chip 226, the fourth memory chip 228, and the first memory chip 222, respectively.

Figure 8:
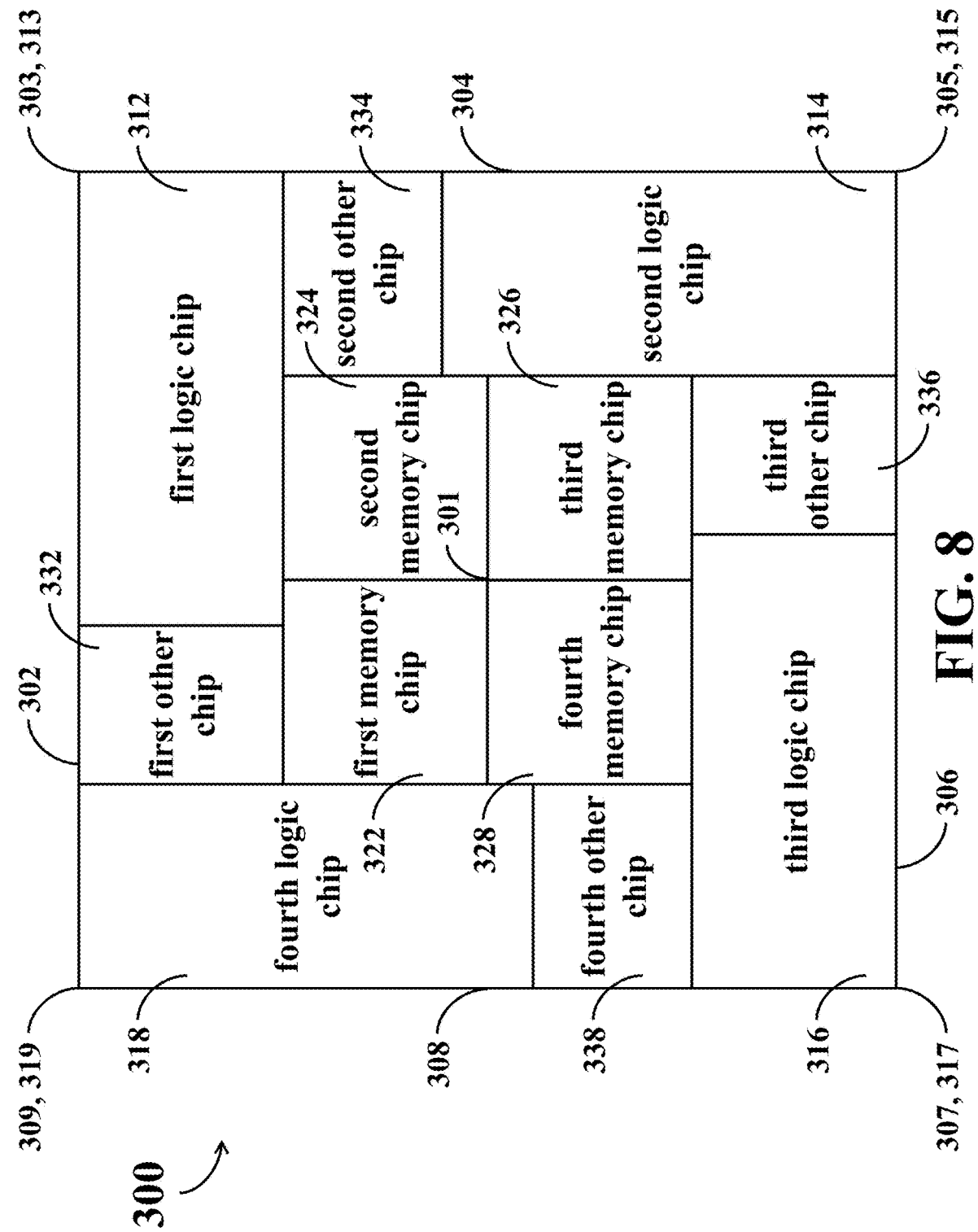
FIG. 8 illustrates a schematic diagram of a simplified chip floorplan arrangement of an IC product according to another embodiment of the present invention.

FIG. 8 is a schematic diagram of a simplified chip floorplan arrangement of an IC product according to another embodiment of the present invention. FIG. 8 shows a top view of the IC product 300. The IC product 300 includes a first logic chip 312, a second logic chip 314, a third logic chip 316, a fourth logic chip 318, a first memory chip 322, a second memory chip 324, a third memory chip 326, a fourth memory chip 328, a first other chip 332, a second other chip 334, a third other chip 336, and a fourth other chip 338. Similar to the IC product 100, the IC product 300 includes a substrate and may or may not include an interposer (please refer to FIGS. 2 and 3).

In some embodiments, the first other chip 332, the second other chip 334, the third other chip 336, and the fourth other chip 338 are I/O chips that contain I/O circuits. In other embodiments, the first other chip 332, the second other chip 334, the third other chip 336, and the fourth other chip 338 are silicon chips that do not contain any circuits.

The first logic chip 312, the second logic chip 314, the third logic chip 316, and the fourth logic chip 318 are located on the first side 302, the second side 304, the third side 306, and the fourth side 308 of the IC product 300, respectively. The first memory chip 322, the second memory chip 324, the third memory chip 326, and the fourth memory chip 328 are located in the central area 360 of the IC product 300. Please refer to FIG. 4. The central area 360 of the IC product 300 is the area where the first memory chip 322, the second memory chip 324, the third memory chip 326, and the fourth memory chip 328 are located.

In some embodiments, the areas of the first logic chip 312, the second logic chip 314, the third logic chip 316, and the fourth logic chip 318 are substantially the same; the areas of the first memory chip 322, the second memory chip 324, the third memory chip 326, and the fourth memory chip 328 are substantially the same; and the areas of the first other chip 332, the second other chip 334, the third other chip 336, and the fourth other chip 338 are substantially the same.

In some embodiments, the first logic chip 312, the second logic chip 314, the third logic chip 316, and the fourth logic chip 318 include substantially the same constituent components; the first memory chip 322, the second memory chip 324, the third memory chip 326, and the fourth memory chip 328 include substantially the same constituent components; and the first other chip 332, the second other chip 334, the third other chip 336, and the fourth other chip 338 include substantially the same constituent components. The constituent components include, but are not limited to, transistors, resistors, capacitors, and/or inductors. In other embodiments, the constituent components of the first logic chip 312, the second logic chip 314, the third logic chip 316, and the fourth logic chip 318 are the same in terms of both type(s) and quantity; the constituent components of the first memory chip 322, the second memory chip 324, the third memory chip 326, and the fourth memory chip 328 are the same in terms of both type(s) and quantity; and the constituent components of the first other chip 332, the second other chip 334, the third other chip 336, and the of the fourth other chip 338 are the same in terms of both type(s) and quantity.

In the embodiment of FIG. 8, the first logic chip 312, the second logic chip 314, the third logic chip 316, and the fourth logic chip 318 collectively surround the central area 360 of the IC product 300. More specifically, the first logic chip 312, the second logic chip 314, the third logic chip 316, and the fourth logic chip 318 do not completely enclose the central area 360 of the IC product 300 because the four sides of the central area 360 of the IC product 300 are not completely adjacent to the first logic chip 312, the second logic chip 314, the third logic chip 316, and the fourth logic chip 318.

The first other chip 332, the second other chip 334, the third other chip 336, and the fourth other chip 338 are located outside the central area 360 of the IC product 300. Each of the first other chip 332, the second other chip 334, the third other chip 336, and the fourth other chip 338 has only one side adjacent to one of the four sides of the IC product 300. More specifically, one side of the first other chip 332, one side of the second other chip 334, one side of the third other chip 336, and one side of the fourth other chip 338 are adjacent to the first side 302, the second side 304, the third side 306, and the fourth side 308, respectively, whereas the other three sides of each of the first other chip 332, the second other chip 334, the third other chip 336, and the fourth other chip 338 are not adjacent to the sides of the IC product 300.

The first logic chip 312, the second logic chip 314, the third logic chip 316, and the fourth logic chip 318 are located at the four corners of the IC product 300, respectively. That is to say, the first vertex 313 of the first logic chip 312 is aligned with the first vertex 303 of the IC product 300, the second vertex 315 of the second logic chip 314 is aligned with the second vertex 305 of the IC product 300, the third vertex 317 of the third logic chip 316 is aligned with the third vertex 307 of the IC product 300, and the fourth vertex 319 of the fourth logic chip 318 is aligned with the fourth vertex 309 of the IC product 300.

If the first logic chip 312, the second logic chip 314, the third logic chip 316, and the fourth logic chip 318 are rotated 180 degrees with respect to the center 301, the first logic chip 312 and the third logic chip 316 substantially overlap, and the second logic chip 314 and the fourth logic chip 318 substantially overlap. In other words, the first logic chip 312 and the third logic chip 316 are point-symmetric with respect to the center 301 (i.e., the center of symmetry), and the second logic chip 314 and the fourth logic chip 318 are point-symmetric. Similarly, the first memory chip 322 and the third memory chip 326 are point-symmetric with respect to the center 301, and the second memory chip 324 and the fourth memory chip 328 are point-symmetric with respect to the center 301. Similarly, the first other chip 332 and the third other chip 336 are point-symmetric with respect to the center 301, and the second other chip 334 and the fourth other chip 338 are point-symmetric with respect to the center 301. In other words, the overall floorplan arrangement of the first logic chip 312, the second logic chip 314, the third logic chip 316, the fourth logic chip 318, the first memory chip 322, the second memory chip 324, the third memory chip 326, the fourth memory chip 328, the first other chip 332, the second other chip 334, the third other chip 336, and the fourth other chip 338 possesses point symmetry with respect to the center 301 of the IC product 300.

In other embodiments, the IC product 300 is a square.

The first logic chip 312 is adjacent to the first memory chip 322, the second memory chip 324, and the first other chip 332, and the relative position between the first logic chip 312 and the first memory chip 322 is substantially identical to the relative position between the second logic chip 314 and the second memory chip 324. More specifically, please refer to FIG. 5 and FIG. 8 at the same time. The first logic chip 312, the first memory chip 322, and the first other chip 332 form the first polygon 132, and the second logic chip 314, the second memory chip 324, and the second other chip 334 form the second polygon 134. If the first polygon 132 is rotated 90 degrees clockwise with respect to the center 301 of the IC product 300, it will completely overlap with the second polygon 134. Similarly, the third logic chip 316 is adjacent to the third memory chip 326, the fourth memory chip 328, and the third other chip 336, and the relative position between the third logic chip 316 and the third memory chip 326 is substantially identical to the relative position between the fourth logic chip 318 and the fourth memory chip 328. In other words, in some embodiments, the first logic chip 312, the second logic chip 314, the third logic chip 316, and the fourth logic chip 318 can access or be coupled to the first memory chip 322, the second memory chip 324, the third memory chip 326, and the fourth memory chip 328, respectively.

From another perspective, the first other chip 332 is adjacent to the first logic chip 312, the fourth logic chip 318, and the first memory chip 322, and the relative position between the first logic chip 312 and the second memory chip 324 is substantially identical to the relative position between the fourth logic chip 318 and the first memory chip 322. More specifically, please refer to FIG. 6 and FIG. 8 at the same time. The fourth logic chip 318, the first memory chip 322, and the fourth other chip 338 form the third polygon 136, and the first logic chip 312, the second memory chip 324, and the first other chip 332 form the fourth polygon 138. If the third polygon 136 is rotated 90 degrees clockwise with respect to the center 301 of the IC product 300, it will completely overlap with the fourth polygon 138. Similarly, the third other chip 336 is adjacent to the second logic chip 314, the third logic chip 316, and the third memory chip 326, and the relative position between the third logic chip 316 and the fourth memory chip 328 is substantially identical to the relative position between the second logic chip 314 and the third memory chip 326. In other words, in other embodiments, the first logic chip 312, the second logic chip 314, the third logic chip 316, and the fourth logic chip 318 can access or be coupled to the second memory chip 324, the third memory chip 326, the fourth memory chip 328, and the first memory chip 322, respectively.

Figure 9:
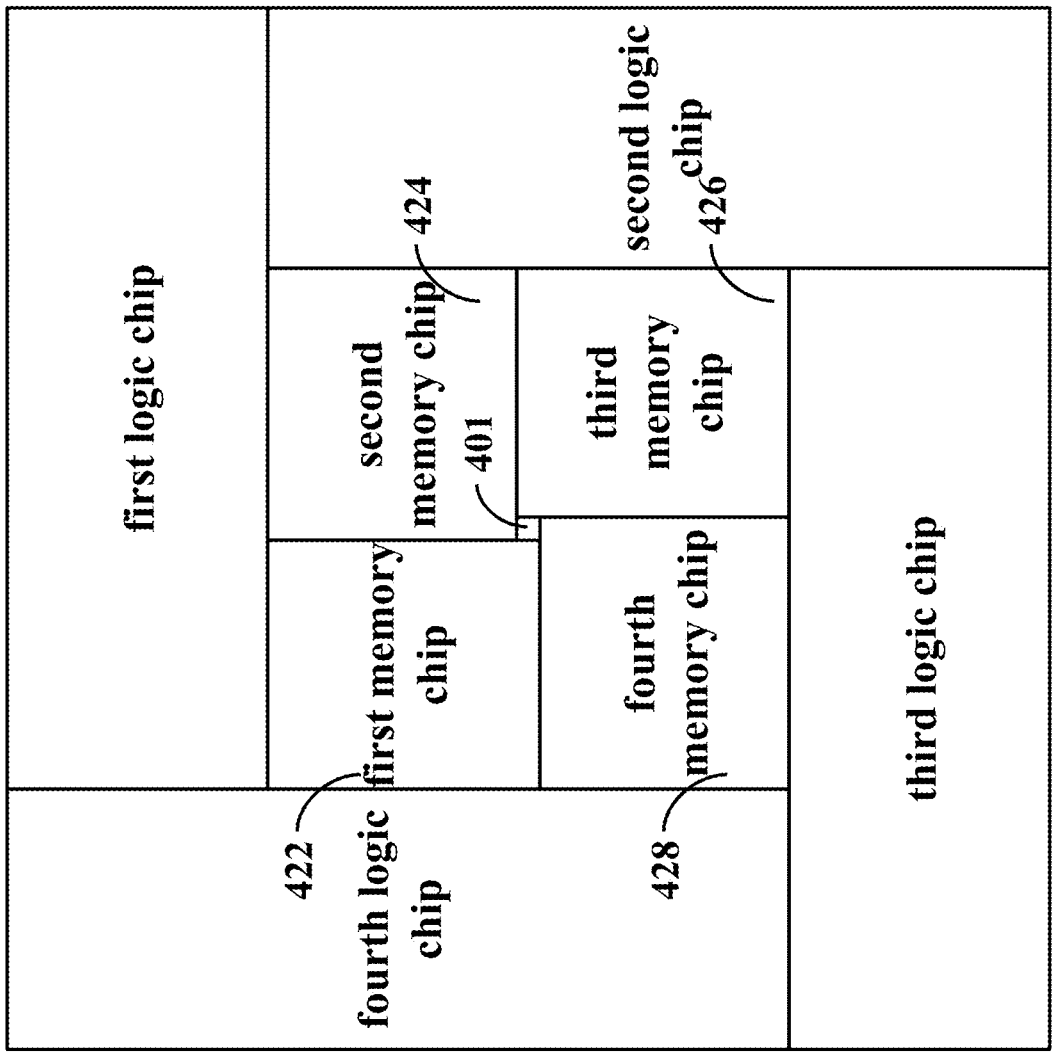
FIG. 9 illustrates a schematic diagram of a simplified chip floorplan arrangement of an IC product according to another embodiment of the present invention.
Figure 10:
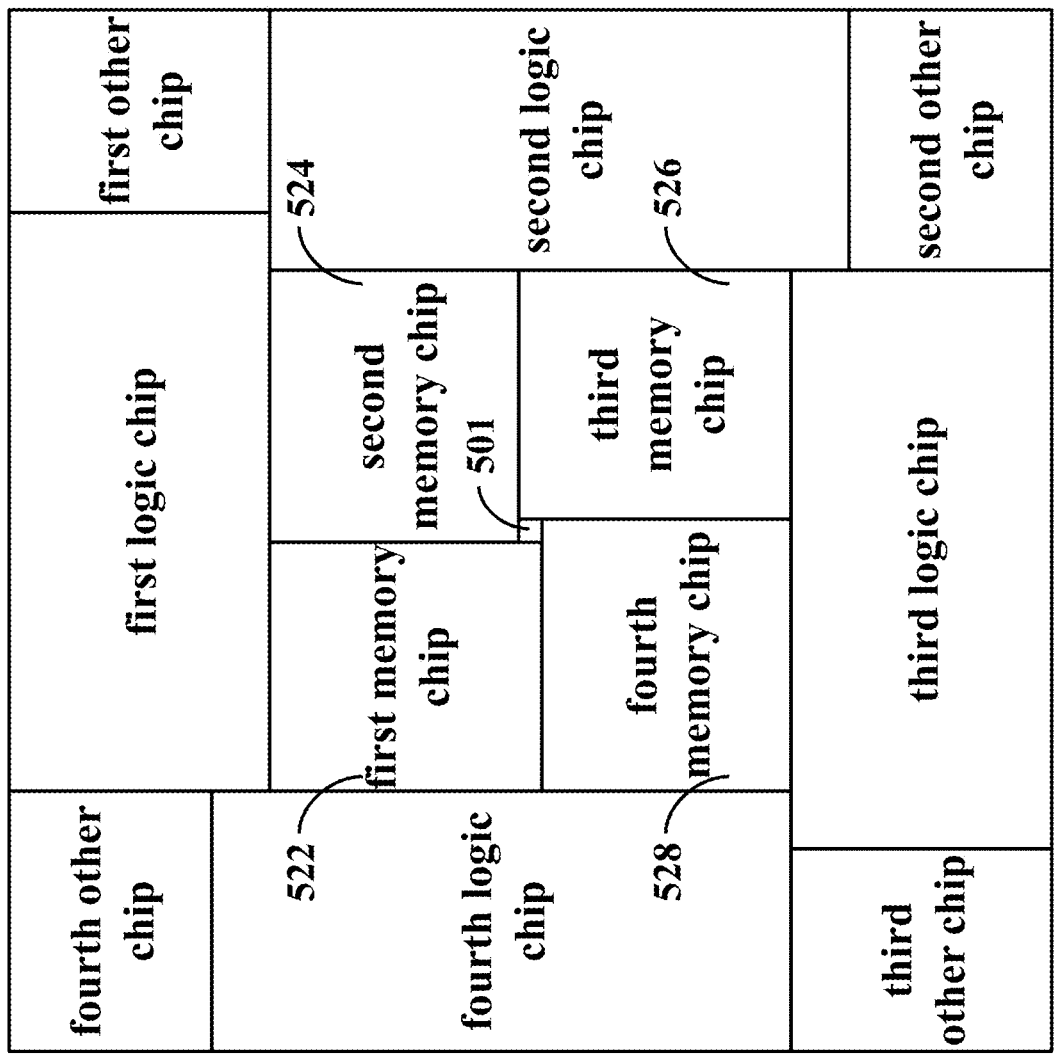
FIG. 10 illustrates a schematic diagram of a simplified chip floorplan arrangement of an IC product according to another embodiment of the present invention.
Figure 11:
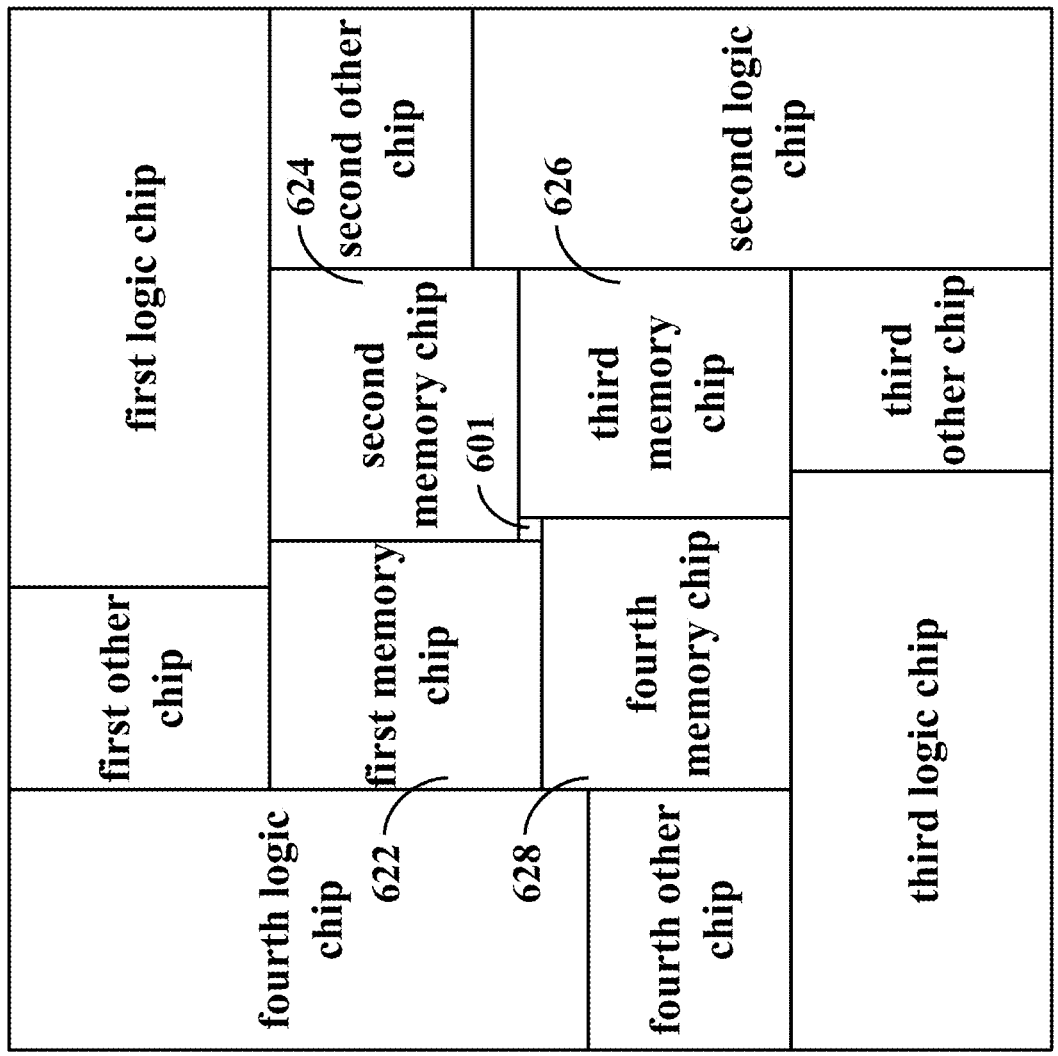
FIG. 11 illustrates a schematic diagram of a simplified chip floorplan arrangement of an IC product according to another embodiment of the present invention.

The first memory chip 122, the second memory chip 124, the third memory chip 126, the fourth memory chip 128, the first memory chip 222, the second memory chip 224, the third memory chip 226, the fourth memory chip 228, the first memory chip 322, the second memory chip 324, the third memory chip 326, and the fourth memory chip 328 in FIGS. 1, 7 and 8 are the high bandwidth memory generation 3 (HBM3) which is square in shape. However, these memory chips can also be the high bandwidth memory generation 2 (HBM2), as shown in FIGS. 9 to 11. The first memory chip 422, the second memory chip 424, the third memory chip 426, the fourth memory chip 428 of the IC product 400, the first memory chip 522, the second memory chip 524, the third memory chip 526, and the fourth memory chip 528 of the IC product 500, and the first memory chip 622, the second memory chip 624, the third memory chip 626, and the fourth memory chip 628 of the IC product 600 are the HBM2. Because the HBM2 is not square, the center 401 of the IC product 400, the center 501 of the IC product 500, and the center 601 of the IC product 600 are not covered by the memory chips. The discussions of FIG. 9, FIG. 10, and FIG. 11 may correspond to the discussions of FIG. 1, FIG. 7 and FIG. 8, respectively, and the details are thus omitted for brevity.

In addition, in other embodiments, the memory chips in FIGS. 9 to 11 may be the Enhanced high bandwidth memory generation 2 (Enhanced HBM2).

In summary, since the logic circuits generally generate more heat than the memory chips, the heat dissipation efficiency of the IC products can be improved by arranging the logic chips on the sides of the IC products. Furthermore, since the logic chips usually need to receive and transmit signals, the input and/or output wiring can be easier by arranging the logic chips on the sides of the IC product. In addition, according to the present invention, the proposed chip floorplan arrangement makes the most of the substrate area by tightly arranging the chips in the IC products, making the IC products more competitive. Moreover, the point-symmetric floorplan arrangements of the chips on the IC product not only avoid pin waste but also simplify the complexity of the photomask since different parts of the IC product can be fabricated using the same photomask.

In another aspect, the aforementioned point-symmetric floorplan arrangement of the chips on the IC product facilitates the semiconductor manufacturers to manufacture, by using the same set of photomasks, the IC products that are nearly four times the area of the photomask, which significantly reduces the manufacturing cost of the IC products.

It should be noted that the floorplan arrangements of the chips on the IC product mentioned above are intended to illustrate the invention by way of examples, rather than to limit the actual implementation of the present invention. For example, in an alternative embodiment, the aforementioned first to fourth memory chips can be arranged in the central area of the IC product in line symmetry with respect to the central axis of the IC product (which passes through the center and is perpendicular to any side), while the first to fourth logic chips are arranged on the periphery of the central area of the IC product in line symmetry with respect to the central axis of the IC product.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to encompass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

In the drawings, the size and relative sizes of some elements may be exaggerated or simplified for clarity. Accordingly, unless the context clearly specifies, the shape, size, relative size, and relative position of each element in the drawings are illustrated merely for clarity, and not intended to be used to restrict the claim scope.

For the purpose of explanatory convenience in the specification, spatially relative terms, such as "on," "above," "below," "beneath," "higher," "lower," "upward," "downward," "forward," "backward," and the like, may be used herein to describe the function of a particular element or to describe the relationship of one element to another element(s) as illustrated in the drawings. It will be understood that the spatially relative terms are intended to encompass different orientations of the element in use, in operations, or in assembly in addition to the orientation depicted in the drawings. For example, if the element in the drawings is turned over, elements described as "on" or "above" other elements would then be oriented "under" or "beneath" the other elements. Thus, the exemplary term "beneath" can encompass both an orientation of above and beneath. For another example, if the element in the drawings is reversed, the action described as "forward" may become "backward," and the action described as "backward" may become "forward." Thus, the exemplary description "forward" can encompass both an orientation of forward and backward.

Throughout the description and claims, it will be understood that when a component is referred to as being "positioned on," "positioned above," "connected to," "engaged with," or "coupled with" another component, it can be directly on, directly connected to, or directly engaged with the other component, or intervening component may be present. In contrast, when a component is referred to as being "directly on," "directly connected to," or "directly engaged with" another component, there are no intervening components present.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. An integrated circuit (IC) product (100; 200; 300), comprising:
   a first chip (112; 212; 312);
   a second chip (114; 214; 314);
   a third chip (116; 216; 316);
   a fourth chip (118; 218; 318);
   a fifth chip (122; 222; 322);
   a sixth chip (124; 224; 324);
   a seventh chip (126; 226; 326); and
   an eighth chip (128; 228; 328);
   wherein the first chip (112; 212; 312), the second chip (114; 214; 314), the third chip (116; 216; 316), and the fourth chip (118; 218; 318) have substantially identical area and constituent components;
   the fifth chip (122; 222; 322), the sixth chip (124; 224; 324), the seventh chip (126; 226; 326), and the eighth chip (128; 228; 328) have substantially identical area and constituent components;
   the first chip (112; 212; 312), the second chip (114; 214; 314), the third chip (116; 216; 316), and the fourth chip (118; 218; 318) are arranged on four sides of the IC product (100; 200; 300), respectively; and
   the fifth chip (122; 222; 322), the sixth chip (124; 224; 324), the seventh chip (126; 226; 326), and the eighth chip (128; 228; 328) are arranged in a central area (160; 260; 360) of the IC product (100; 200; 300);
   wherein any chip of the first chip (112; 212; 312), the second chip (114; 214; 314), the third chip (116; 216; 316), and the fourth chip (118; 218; 318) is coupled to one of the fifth chip (122; 222; 322), the sixth chip (124; 224; 324), the seventh chip (126; 226; 326), and the eighth chip (128; 228; 328).

2. The IC product (100; 200; 300) of claim 1, wherein a floorplan arrangement of the first chip (112; 212; 312), the second chip (114; 214; 314), the third chip (116; 216; 316), and the fourth chip (118; 218; 318) possesses point symmetry with respect to a center (101; 201; 301) of the IC product (100; 200; 300), and a floorplan arrangement of the fifth chip (122; 222; 322), the sixth chip (124; 224; 324), the seventh chip (126; 226; 326), and the eighth chip (128; 228; 328) possesses point symmetry with respect to the center (101; 201; 301).

3. The IC product (100; 200; 300) of claim 1, wherein the first chip (112; 212; 312), the second chip (114; 214; 314), the third chip (116; 216; 316), and the fourth chip (118; 218; 318) are arranged in a circle.

4. The IC product (100) of claim 1, wherein the first chip (112) is adjacent to the fourth chip (118) and the second chip (114), the second chip (114) is adjacent to the first chip (112) and the third chip (116), the third chip (116) is adjacent to the second chip (114) and the fourth chip (118), and the fourth chip (118) is adjacent to the third chip (116) and the first chip (112).

5. The IC product (100; 200; 300) of claim 1, wherein the first chip (112; 212; 312), the second chip (114; 214; 314), the third chip (116; 216; 316), and the fourth chip (118; 218; 318) are logic chips, and the fifth chip (122; 222; 322), the sixth chip (124; 224; 324), the seventh chip (126; 226; 326), and the eighth chip (128; 228; 328) are memory chips.

6. The IC product (100) of claim 1, wherein the first chip (112) and the fifth chip (122) form a first polygon (132), and the second chip (114) and the sixth chip (124) form a second polygon (134), and if the first polygon (132) is rotated ninety degrees with respect to a center (101) of the IC product (100), the first polygon (132) will completely overlap with the second polygon (134).

7. The IC product (100) of claim 1, wherein the fourth chip (118) and the fifth chip (122) form a third polygon (136), and the first chip (112) and the sixth chip (124) form a fourth polygon (138), and if the third polygon (136) is rotated ninety degrees with respect to a center (101) of the IC product (100), the third polygon (136) will completely overlap with the fourth polygon (138).

8. The IC product (100; 200; 300) of claim 1, wherein the first chip (112; 212; 312), the second chip (114; 214; 314), the third chip (116; 216; 316), and the fourth chip (118; 218; 318) collectively surround the central area (160; 260; 360).

9. The IC product (100; 200) of claim 8, wherein the first chip (112; 212), the second chip (114; 214), the third chip (116; 216), and the fourth chip (118; 218) completely enclose the central area (160; 260).

10. The IC product (200; 300) of claim 1 further comprising:
    a ninth chip (232; 332);
    a tenth chip (234; 334);
    an eleventh chip (236; 336); and
    a twelfth chip (238; 338);
    wherein the ninth chip (232; 332), the tenth chip (234; 334), the eleventh chip (236; 336), and the twelfth chip (238; 338) are arranged outside the central area (260; 360).

11. The IC product (200) of claim 10, wherein the ninth chip (232), the tenth chip (234), the eleventh chip (236), and the twelfth chip (238) are arranged at four corners of the IC product (200).

12. The IC product (300) of claim 10, wherein the first chip (312), the second chip (314), the third chip (316), and the fourth chip (318) are arranged at four corners of the IC product (300).

13. The IC product (200; 300) of claim 10, wherein the first chip (212; 312), the fifth chip (222; 322), and the ninth chip (232; 332) form a first polygon (132), the second chip (214; 314), the sixth chip (224; 324), and the tenth chip (234; 334) form a second polygon (134), and if the first polygon (132) is rotated ninety degrees with respect to a center (201; 301) of the IC product (200; 300), the first polygon (132) will completely overlap with the second polygon (134).

14. The IC product (200; 300) of claim 10, wherein the fourth chip (218; 318), the fifth chip (222; 322), and the twelfth chip (238; 338) form a third polygon (136), the first chip (212; 312), the sixth chip (224; 324), and the ninth chip (232; 332) form a fourth polygon (138), and if the third polygon (136) is rotated ninety degrees with respect to a center (201; 301) of the IC product (200; 300), the third polygon (136) will completely overlap with the fourth polygon (138).

15. An integrated circuit (IC) product (100; 200; 300) having a first side (102; 202; 302), a second side (104; 204; 304), a third side (106; 206; 306), and a fourth side (108; 208; 308), comprising:
    a first logic chip (112; 212; 312), arranged on the first side (102; 202; 302);
    a second logic chip (114; 214; 314), arranged on the second side (104; 204; 304);
    a third logic chip (116; 216; 316), arranged on the third side (106; 206; 306);
    a fourth logic chip (118; 218; 318), arranged on the fourth side (108; 208; 308);
    a first memory chip (122; 222; 322);
    a second memory chip (124; 224; 324);
    a third memory chip (126; 226; 326); and
    a fourth memory chip (128; 228; 328);
    wherein a floorplan arrangement of the first logic chip (112; 212; 312), the second logic chip (114; 214; 314), the third logic chip (116; 216; 316), and the fourth logic chip (118; 218; 318) possesses point symmetry with respect to a center (101; 201; 301) of the IC product (100; 200; 300), and a floorplan arrangement of the first memory chip (122; 222; 322), the second memory chip (124; 224; 324), the third memory chip (126; 226; 326), and the fourth memory chip (128; 228; 328) possesses point symmetry with respect to the center (101; 201; 301);
    wherein any chip of the first logic chip (112; 212; 312), the second logic chip (114; 214; 314), the third logic chip (116; 216; 316), and the fourth logic chip (118; 218; 318) is coupled to one of the first memory chip (122; 222; 322), the second memory chip (124; 224; 324), the third memory chip (126, 226, 326), and the fourth memory chip (128, 228, 328).

16. The IC product (100; 200; 300) of claim 15, wherein the first logic chip (112; 212; 312), the second logic chip (114; 214; 314), the third logic chip (116; 216; 316), and the fourth logic chip (118; 218; 318) are substantially identical in area.

17. The IC product (100; 200; 300) of claim 15, wherein the first memory chip (122; 222; 322), the second memory chip (124; 224; 324), the third memory chip (126; 226; 326), and the fourth memory chip (128; 228; 328) are substantially identical in area.

18. The IC product (100; 200; 300) of claim 15, wherein the first logic chip (112; 212; 312), the second logic chip (114; 214; 314), the third logic chip (116; 216; 316), and the fourth logic chip (118; 218; 318) are arranged in a circle.

19. The IC product (100; 200; 300) of claim 15, wherein the first logic chip (112; 212; 312), the second logic chip (114; 214; 314), the third logic chip (116; 216; 316), and the fourth logic chip (118; 218; 318) collectively surround a central area (160; 260; 360) of the IC product (100; 200; 300).

20. The IC product (100; 200) of claim 19, wherein the first logic chip (112; 212), the second logic chip (114; 214), the third logic chip (116; 216), and the fourth logic chip (118; 218) completely enclose the central area (160; 260).

* * * * *